United States Patent
Narasimhan

(10) Patent No.: US 10,820,405 B1
(45) Date of Patent: *Oct. 27, 2020

(54) APPARATUS, SYSTEM, AND METHOD FOR IMPROVED COOLING OF COMPUTING COMPONENTS WITH HEATSINKS

(71) Applicant: Juniper Networks, Inc., Sunnyvale, CA (US)

(72) Inventor: Susheela Nanjunda Rao Narasimhan, Fremont, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/374,436

(22) Filed: Apr. 3, 2019

Related U.S. Application Data

(63) Continuation of application No. 15/640,498, filed on Jul. 1, 2017, now Pat. No. 10,299,365.

(51) Int. Cl.
| | |
|---|---|
| *H05K 1/02* | (2006.01) |
| *H05K 1/18* | (2006.01) |
| *H05K 7/20* | (2006.01) |
| *G06F 1/20* | (2006.01) |

(52) U.S. Cl.
CPC ........... *H05K 1/0203* (2013.01); *H05K 1/181* (2013.01); *H05K 7/2039* (2013.01); *G06F 1/20* (2013.01)

(58) Field of Classification Search
CPC ............ H05K 7/20145; H05K 7/20163; H01L 23/467

USPC .......................................... 361/697, 704, 719
See application file for complete search history.

(56) References Cited

U.S. PATENT DOCUMENTS

| | | |
|---|---|---|
| 6,308,771 B1 | 10/2001 | Tavassoli |
| 6,836,409 B1 * | 12/2004 | Duxbury .............. G02B 6/4277 165/185 |
| 7,079,390 B2 | 7/2006 | Barr et al. |
| 7,359,191 B2 | 4/2008 | Yamana et al. |
| 7,367,385 B1 | 5/2008 | Materna |
| 8,081,465 B2 | 12/2011 | Nishiura |
| 8,154,869 B2 * | 4/2012 | Riebel ....................... G06F 1/20 165/185 |
| 8,665,595 B2 | 3/2014 | Wyatt et al. |
| 2005/0041391 A1 * | 2/2005 | Wrycraft ................... G06F 1/20 361/695 |
| 2008/0041562 A1 | 2/2008 | Bhatia |
| 2013/0112373 A1 * | 5/2013 | Fukai .................. F28D 15/0266 165/104.21 |

* cited by examiner

Primary Examiner — Mukundbhai G Patel
(74) Attorney, Agent, or Firm — FisherBroyles, LLP

(57) ABSTRACT

The disclosed heatsink apparatus may include (i) a base that facilitates thermal transfer between a computing component and cooling airflow, (ii) a plurality of fins, extending from the base, that provide additional surface area to facilitate the thermal transfer between the computing component and the cooling airflow, (iii) at least one channel, defined within the plurality of fins, that facilitates a faster passage of a portion of the cooling airflow across the heatsink apparatus, and (iv) at least one air dam that prevents the cooling airflow from escaping a designated path on a printed circuit board. Various other apparatuses, systems, and methods are also disclosed.

20 Claims, 9 Drawing Sheets

APPARATUS, SYSTEM, AND METHOD FOR IMPROVED COOLING OF COMPUTING COMPONENTS WITH HEATSINKS

CROSS REFERENCE TO RELATED APPLICATION

This application is a continuation of U.S. application Ser. No. 15/640,498 filed 1 Jul. 2017, the disclosure of which is incorporated, in its entirety, by this reference.

BACKGROUND

Computing components, such as processors, often require certain temperature ranges to perform at optimal levels. Components that overheat, while a computer is running, may cause serious problems with the functions of the computer. Therefore, proper ventilation and heat dispersion is necessary to the design of such components. To improve heat dispersion, heatsinks are often installed to help regulate the temperature of individual components. For example, liquid coolants may be used to provide cooler temperatures to a component in exchange for removing some of the heat generated by the component. Furthermore, heatsinks using air flow are often preferred over liquid heatsinks due to the potential risk of contact between liquid and electronic components. In these cases, fans and other devices may provide cooler air to the heatsink, which may then transfer heat away from the components.

For larger computing devices, multiple heatsinks may be required to reduce the temperature of multiple computing components. However, cooling air becomes less effective after cooling each heatsink. For example, components and heatsinks placed in series may be subjected to large air pressure changes from one component to the next due to a decreased speed of air passing through each heatsink. Additionally, as the air cools each heatsink and takes on more warmth from heated components, components further away from the source of cooling air may be at greater risk of overheating. The instant disclosure, therefore, identifies and addresses a need for additional and improved apparatuses, systems, and methods for cooling computing components with heatsinks.

SUMMARY

As will be described in greater detail below, the instant disclosure generally relates to apparatuses, systems, and methods for improved cooling of computing components with heatsinks. In one example, a heatsink apparatus for accomplishing such a task may include a base that facilitates thermal transfer between a computing component and cooling airflow and a plurality of fins, extending from the base, that provide additional surface area to facilitate the thermal transfer between the computing component and the cooling airflow. The heatsink apparatus may also include one or more channels, defined within the plurality of fins, that facilitates a faster passage of a portion of the cooling airflow across the heatsink apparatus. Additionally, the heatsink apparatus may include one or more air dams that prevent the cooling airflow from escaping a designated path on a printed circuit board.

Similarly, a computer cooling system incorporating the above-described apparatus may include a printed circuit board and one or more central computing components mounted on the printed circuit board. The system may also include a modified heatsink coupled to the central computing component such that the modified heatsink facilitates thermal transfer between the central computing component and cooling airflow. In this embodiment, the modified heatsink may include (i) a base coupled to the central computing component, (ii) a plurality of fins extending from the base, (iii) one or more channels, defined within the plurality of fins, that facilitates a faster passage of a portion of the cooling airflow across the modified heatsink, and (iv) one or more air dams, extending from the modified heatsink, that prevents the cooling airflow from escaping a designated path on the printed circuit board.

A corresponding method may include coupling a heatsink apparatus to a computing component to facilitate thermal transfer between the computing component and cooling airflow. The method may also include extending a plurality of fins from a base of the heatsink apparatus to provide additional surface area to facilitate the thermal transfer between the computing component and the cooling airflow. Additionally, the method may include defining one or more channels within the plurality of fins to facilitate a faster passage of a portion of the cooling airflow across the heatsink apparatus. Furthermore, the method may include extending one or more air dams from the heatsink apparatus to prevent the cooling airflow from escaping a designated path on a printed circuit board.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the instant disclosure.

Figure 1:
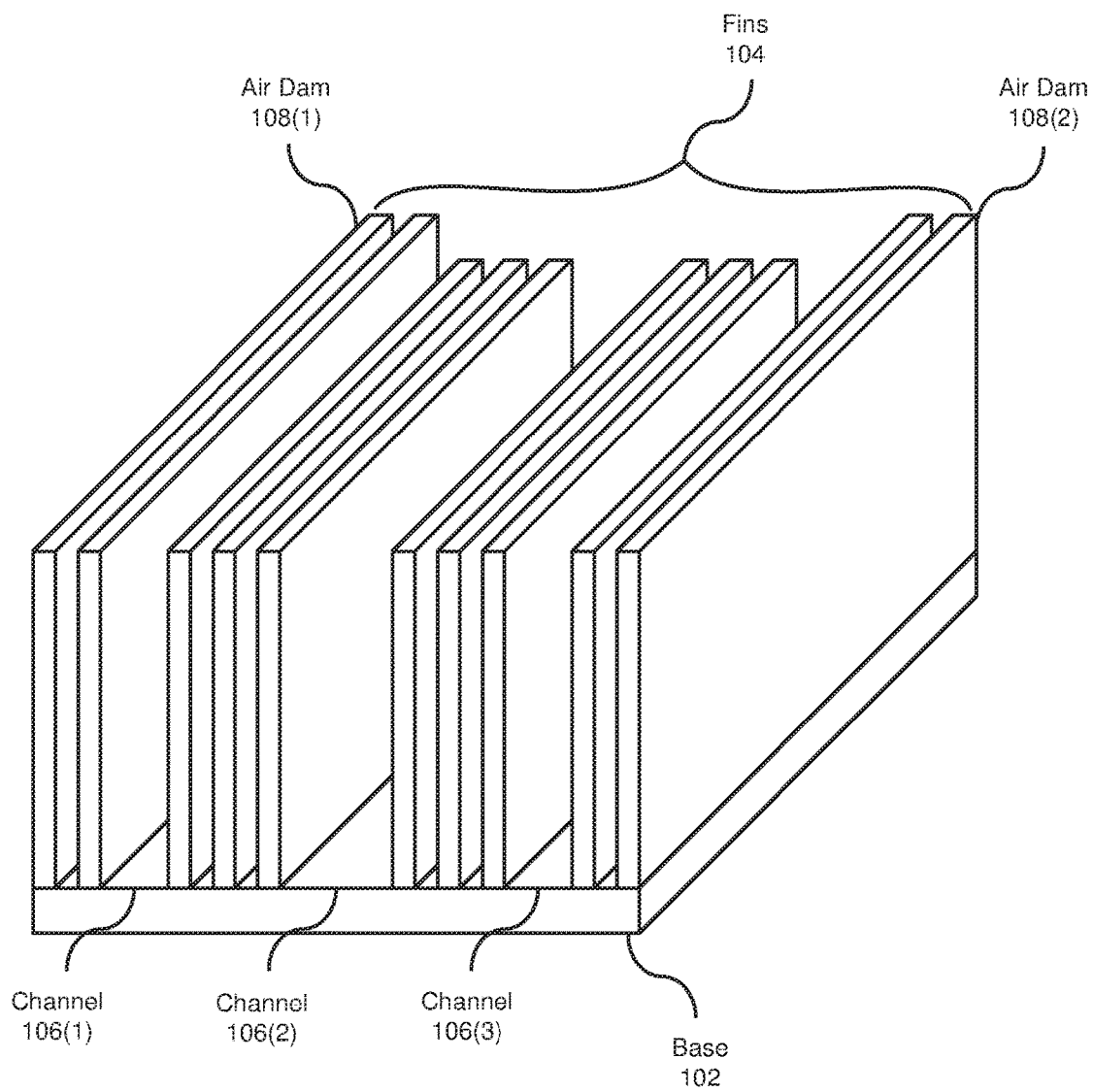
FIG. 1 is an illustration of an example modified heatsink for improved cooling of computing components.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the instant disclosure covers all modifications, equivalents, and alternatives falling within the scope of the appended claims.

DETAILED DESCRIPTION OF EXAMPLE EMBODIMENTS

The present disclosure describes various apparatuses, systems, and methods for improved cooling of computing components with heatsinks. As will be explained in greater detail below, embodiments of the instant disclosure may provide more efficient cooling for multiple computing components by creating channels to direct air to components further from a source of cooling airflow. The channels may be designed to maximize the use of multiple heatsinks and facilitate faster and cooler airflow for a portion of the incoming air. U-shaped insulators may also be used to reduce thermal transfer between heatsinks and the airflow through a channel, such that the air maintains lower temperatures and higher speeds while traveling through the channel. Additionally, the modified heatsinks described herein may include air dams extending from the modified heatsinks to further direct air to adjacent heatsinks. Thus, the disclosed embodiments, whether used alone or in combination, may optimize holistic cooling of computing components.

Figure 2:
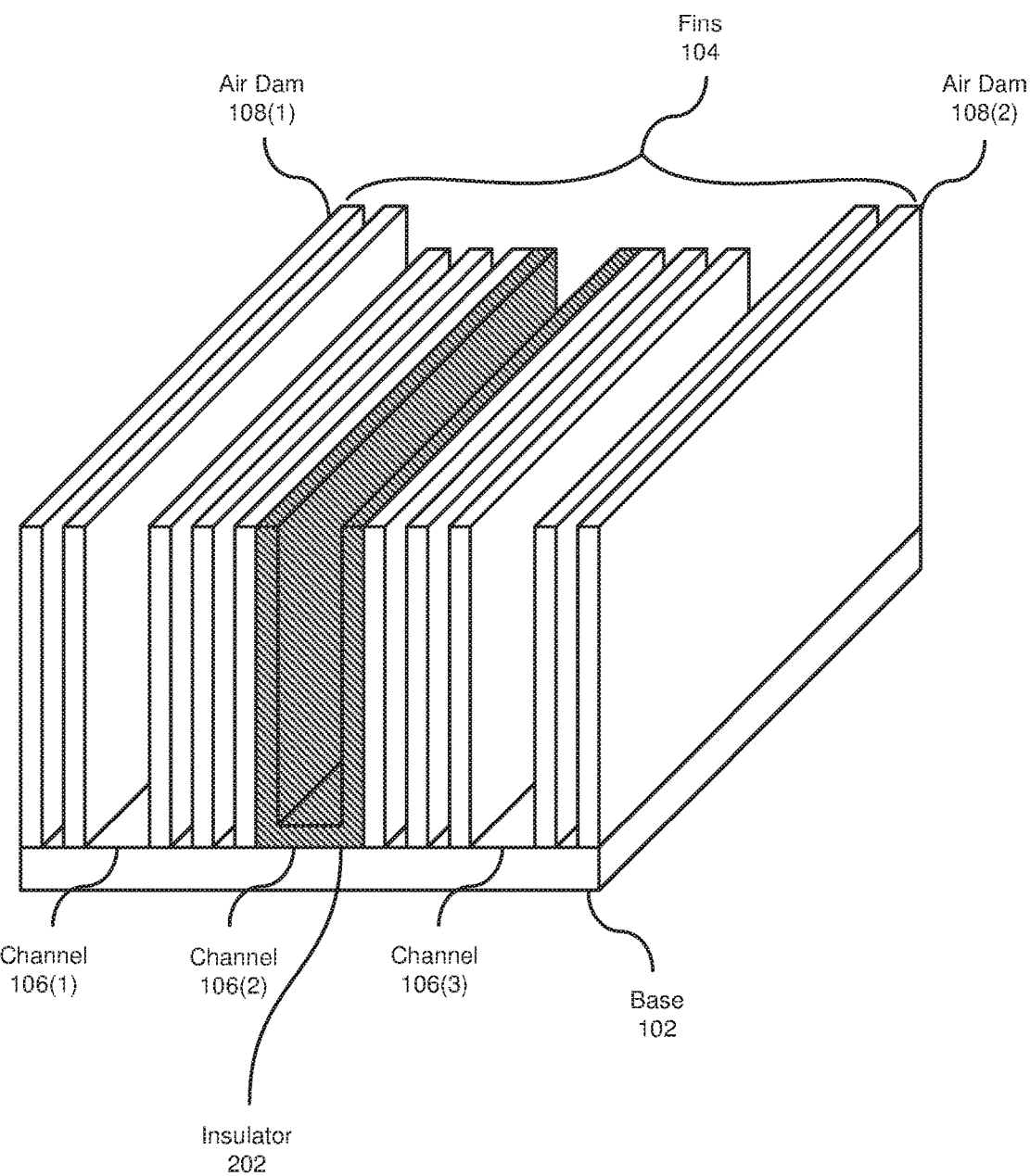
FIG. 2 is an illustration of an example insulator fitted to an example modified heatsink.
Figure 3:
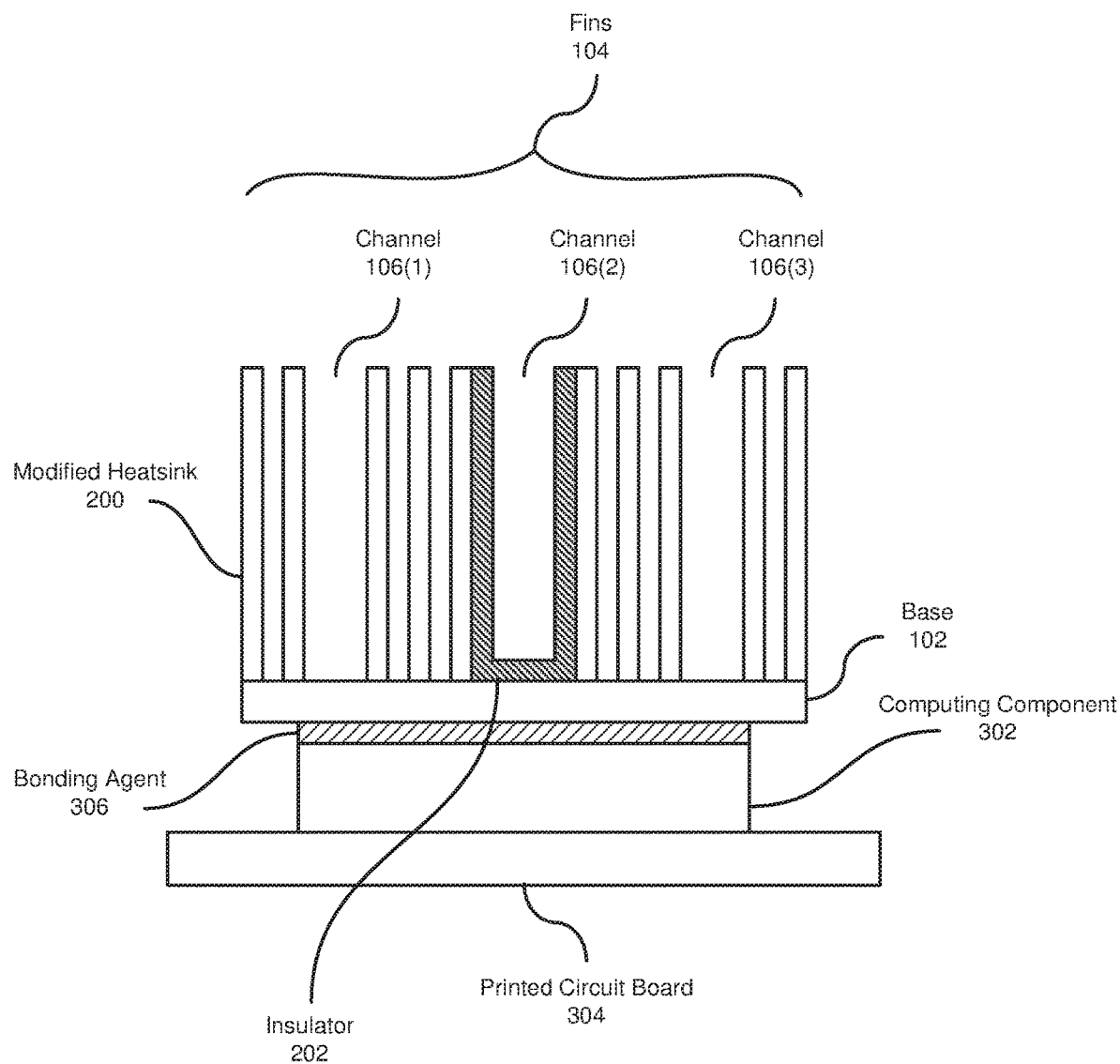
FIG. 3 is an illustration of an example modified heatsink coupled to a computing component on a printed circuit board.

The following will provide, with reference to FIGS. 1-3, detailed descriptions of modified heatsinks for improved cooling of computing components. In addition, the discussion corresponding to FIGS. 4-5 will provide examples of modified heatsinks coupled to channel-less heatsinks. Furthermore, the discussion associated with FIGS. 7-8 will provide examples of computer cooling systems that incorporate modified heatsinks and channel-less heatsinks. Finally, the discussion corresponding to FIG. 9 will provide a detailed description of an example method for improved cooling of computing components with heatsinks.

FIG. 1 illustrates a modified heatsink 100 for improved cooling of computing components. As used herein, the term "heatsink" generally refers to an apparatus that absorbs and transfers heat from a device to a fluid or air, thereby cooling the device through a process of thermal transfer. The term "thermal transfer," as used herein, generally refers to a process of exchanging heat between two devices or mediums. Notably, during thermal transfer, one device or medium may become cooler while the other device or medium may become warmer.

As illustrated in FIG. 1, modified heatsink 100 may include a base 102 that facilitates thermal transfer between a computing component and cooling airflow. Modified heatsink 100 may also include a plurality of fins 104, extending from base 102, that provide additional surface area to facilitate the thermal transfer between the computing component and the cooling airflow. By increasing the total surface area of the heatsink via fins 104, modified heatsink 100 may provide more heat exchange at a faster rate for the computing component. Additionally, modified heatsink 100 may include channels 106(1), 106(2), and 106(3), defined within the plurality of fins, that facilitate a faster passage of a portion of the cooling airflow across the heatsink apparatus. Furthermore, modified heatsink 100 may include an air dam 108(1) and an air dam 108(2) that prevent the cooling airflow from escaping a designated path on a printed circuit board. The term "printed circuit board," as used herein, generally refers to a physical board on which computing components may be attached or embedded such that the board provides electrical connections between the computing components.

In the example of FIG. 1, base 102 and fins 104 may be designed in various shapes and sizes to fit the computing component. For example, base 102 may represent a larger base to cover a larger component or a curved base for a rounded component. Similarly, fins 104 may increase in surface area or be curved to provide an appropriate amount of thermal transfer. Fins 104 may also represent varying densities or numbers of fins, based on requirements for thermal transfer. Additionally, the number or shape of the channels and air dams may change based on a desired path of airflow or an optimum amount of thermal transfer for the computing component. For example, channel 106(1) may be removed to allow more fins to provide more thermal transfer for the computing component. As another example, air dam 108(1) may be bent to allow airflow to a diagonally adjacent heatsink.

FIG. 2 illustrates a U-shaped insulator 202 fitted to a modified heatsink 200. As used herein, the term "insulator" generally refers to an apparatus or a medium that reduces thermal transfer. Insulator 202 may be fitted to channel 106(2) such that insulator 202 provides insulation to reduce thermal transfer between modified heatsink 200 and the portion of the cooling airflow moving through channel 106(2). In these examples, insulator 202 may represent a U-shape to cover the exposed fins and base 102 in channel 106(2). Insulator 202 may then minimize the amount of heat transferred from modified heatsink 200 to the cooling airflow. For example, insulator 202 may represent a material of low thermal conductivity, such as fiberglass, compared to the material of modified heatsink 200, such as aluminum. Alternatively, insulator 202 may represent a malleable material spread onto the surfaces of channel 106(2). Insulator 202 may ensure airflow through channel 106(2) remains cooler than airflow through fins 104 and/or airflow through uninsulated channel 106(1) and channel 106(3).

FIG. 3 illustrates an alternate view of modified heatsink 200 of FIG. 2 coupled to a computing component 302 on a printed circuit board 304. In this embodiment, base 102 may be coupled to computing component 302 such that modified heatsink 200 facilitates the thermal transfer between computing component 302 and the cooling airflow. Additionally, modified heatsink 200 may be coupled to computing component 302 by coupling base 102 to computing component 302 with a bonding agent 306. The term "bonding agent," as used herein, generally refers to a material with adhesive properties that attaches two separate components together. Notably, bonding agents may provide increased contact and/or better thermal transfer between heatsinks and computing components. In the example of FIG. 3, bonding agent 306 may represent an epoxy material that increases heat exchange and reduces potential gaps between computing component 302 and modified heatsink 200. In an alternative embodiment, modified heatsink 200 may be directly mounted on printed circuit board 304 such that base 102 is in contact with computing component 302. In this embodiment, modified heatsink 200 may be mechanically anchored to printed circuit board 304, such as through the use of pins or clips.

Figure 4:
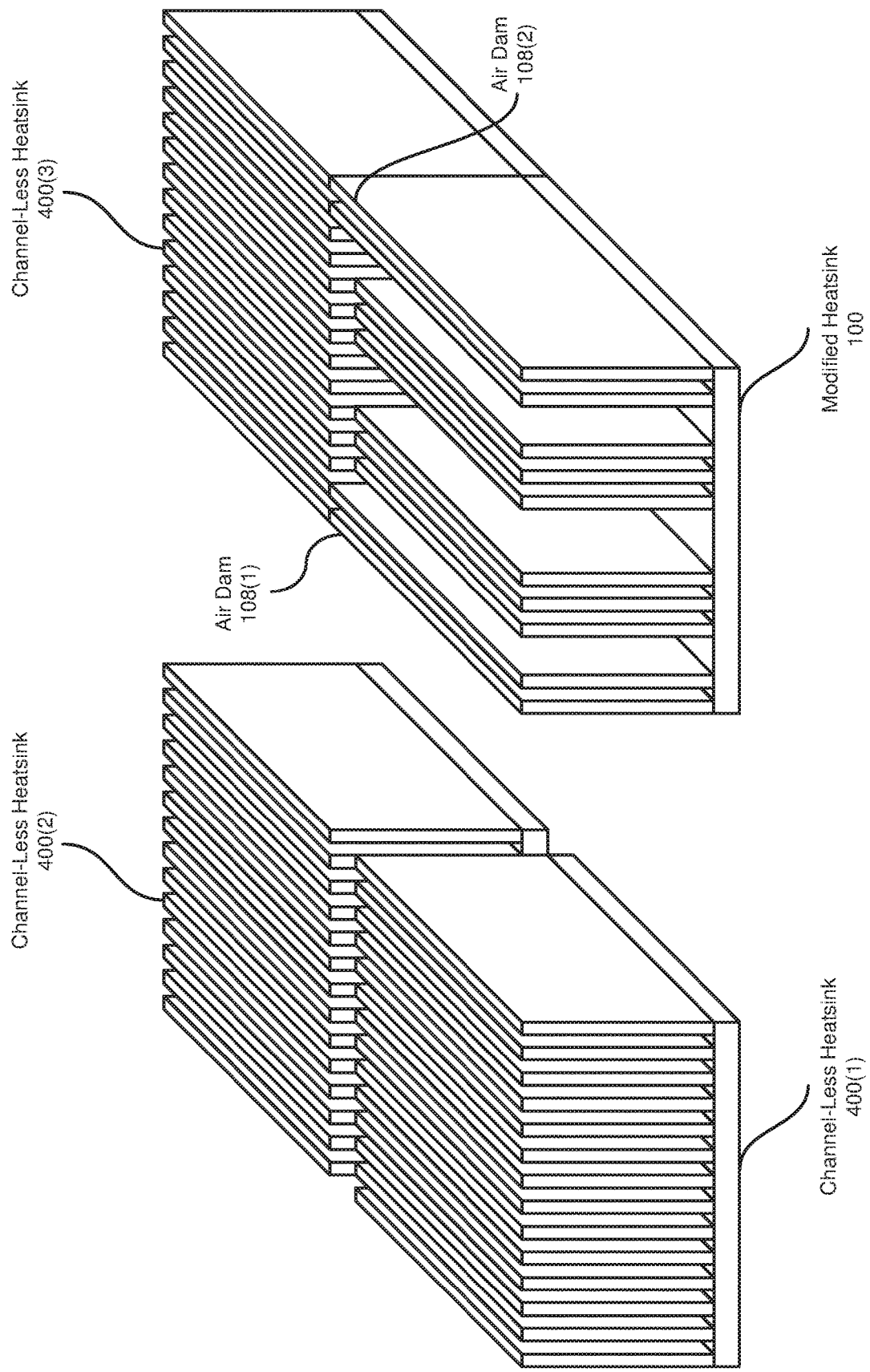
FIG. 4 is a comparison of example channel-less heatsinks in series compared to an example modified heatsink in series with a single channel-less heatsink.

FIG. 4 illustrates a comparison of two channel-less heatsinks in series (e.g., a channel-less heatsink 400(1) and a channel-less heatsink 400(2)) compared to modified heatsink 100 in series with a single channel-less heatsink 400(3).

In these examples, air dam 108(1) and air dam 108(2) extend from modified heatsink 100 such that the cooling airflow is directed to adjacent channel-less heatsink 400(3). In alternate examples, air dams 108(1) and 108(2) may direct airflow to an adjacent computing component. Furthermore, in addition to directing airflow to a downstream component, such as channel-less heatsink 400(3), air dam 108(1) and/or air dam 108(2) may direct airflow to an adjacent side component. In contrast, cooling airflow may escape from the gap between channel-less heatsink 400(1) and channel-less heatsink 400(2) before reaching channel-less heatsink 400(2).

In the example of FIG. 4, channel-less heatsink 400(3) may represent a heatsink furthest away from a source of cooling airflow. In this example, channel-less heatsink 400(3) may be coupled to an edge computing component such that channel-less heatsink 400(3) facilitates thermal transfer between the edge computing component and the cooling airflow. Channel-less heatsinks 400(1), 400(2), and 400(3) may each include a secondary base coupled to an edge computing component and a plurality of channel-less fins extending from the secondary base. In contrast to modified heatsink 100, channel-less heatsink 400(3) may not include channels or air dams, especially for an edge component with no additional components further downstream to which airflow needs to be directed.

Figure 5:
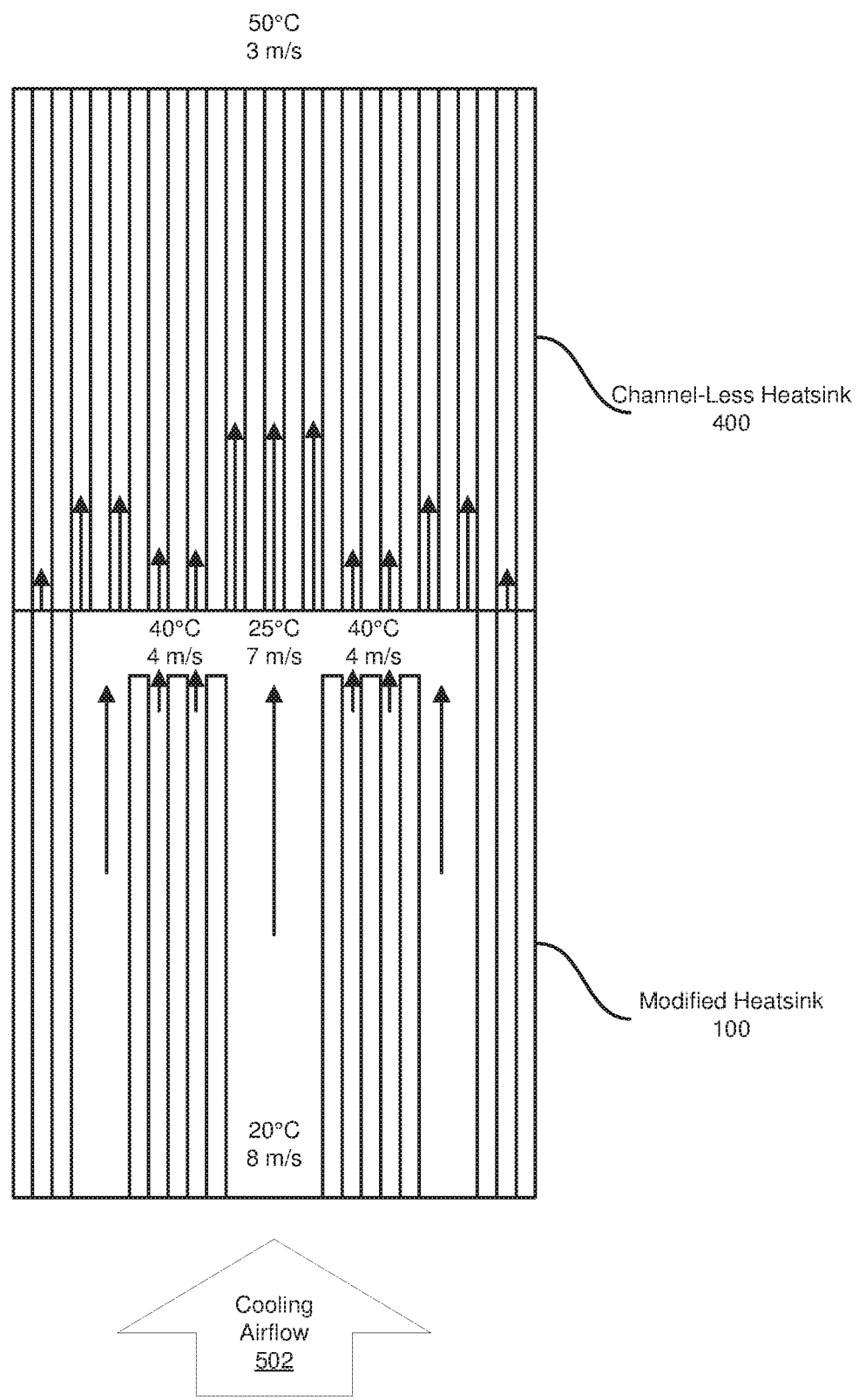
FIG. 5 is an illustration of example airflow and temperatures for an example modified heatsink in series with a channel-less heatsink.

FIG. 5 shows example airflow and temperatures for modified heatsink 100 in series with a channel-less heatsink 400. As shown in FIG. 5, cooling airflow 502 may first cool modified heatsink 100 before reaching channel-less heatsink 400. The plurality of fins of modified heatsink 100 may facilitate thermal transfer between the base and cooling airflow 502 and control a direction of cooling airflow 502, namely, toward channel-less heatsink 400. Similarly, the channels of modified heatsink 100 may control the direction of the portion of cooling airflow 502 through the channels. Additionally, the channels may increase a speed and decrease a temperature of the portion of cooling airflow 502 in comparison to cooling airflow 502 moving between the plurality of fins.

In the example of FIG. 5, cooling airflow 502 may have an initial speed of 8 m/s and an initial temperature of 20° C. Cooling airflow 502 moving through the middle channel may result in a slightly decreased speed of 7 m/s and a temperature of 25° C. In contrast, cooling airflow 502 moving between the fins on either side of the middle channel may result in a lower speed of 4 m/s and more transferred heat from modified heatsink 100, causing a higher temperature of 40° C. Cooling airflow 502 may then continue to cool channel-less heatsink 400, resulting in a final output of 3 m/s and 50° C. In this example, the channels of modified heatsink 100 provides cooler and faster airflow to channel-less heatsink 400 than a heatsink without channels would provide.

Figure 6:
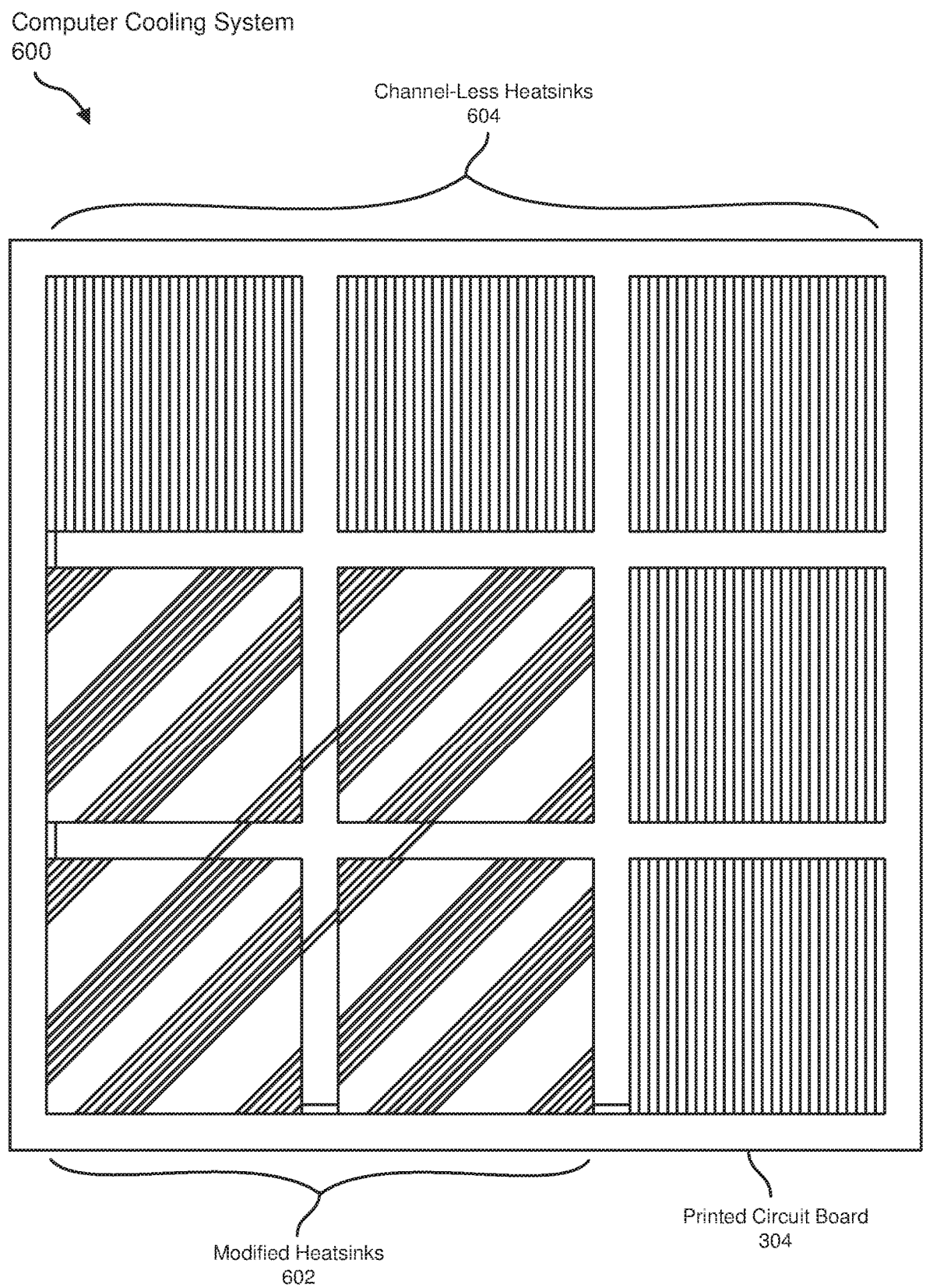
FIG. 6 is an illustration of an example computer cooling system with modified heatsinks and channel-less heatsinks on a printed circuit board.

FIG. 6 illustrates a computer cooling system 600 with modified heatsinks 602 and channel-less heatsinks 604 on printed circuit board 304. In this embodiment, the channels of modified heatsinks 602 may be designed based on a location of each modified heatsink on printed circuit board 304. For example, with channel-less heatsinks 604 located to the top and right of modified heatsinks 602, the channels and fins of modified heatsinks 602 may be designed diagonally to optimally direct cooling airflow to channel-less heatsinks 604. Alternatively, each individual modified heatsink may be designed differently depending on a position on printed circuit board 304 and the adjacent heatsinks. Each channel of each modified heatsink may also be insulated or partly insulated with additional U-shaped insulators such that each U-shaped insulator provides thermal insulation for a particular channel. For example, the bottom left modified heatsink may not include a U-shaped insulator, but the middle modified heatsink may require insulators to further facilitate a faster speed and lower temperature of airflow from the bottom left modified heatsink to channel-less heatsinks 604.

Although not illustrated in FIG. 6, computer cooling system 600 may include one or more central computing components mounted to printed circuit board 304. Modified heatsinks 602 may then be coupled to the central computing components to facilitate thermal transfer between the central computing components and cooling airflow. Each modified heatsink may represent modified heatsink 100 of FIG. 1, modified heatsink 200 of FIG. 2, and/or any other modified heatsink that includes (i) a base coupled to a central computing component, (ii) a plurality of fins extending from the base, (iii) one or more channels, defined within the plurality of fins, that facilitate a faster passage of a portion of the cooling airflow across the modified heatsink, and one or more air dams, extending from the modified heatsink, that prevent the cooling airflow from escaping a designated path on the printed circuit board. In the example of FIG. 6, modified heatsinks 602 may include air dams to prevent cooling airflow from escaping the left and bottom of the set of heatsinks and to facilitate faster passage of cooling airflow between channels of adjacent modified heatsinks.

Similarly, each channel-less heatsink in channel-less heatsinks 604 may be coupled to an edge computing component to facilitate thermal transfer between the edge computing component and cooling airflow. Channel-less heatsinks 604 may represent channel-less heatsink 400(1)-400(3) in FIG. 4, channel-less heatsink 400 in FIG. 5, and/or any other channel-less heatsink that includes a base coupled to an edge computing component and a plurality of fins extending from the base. Channel-less heatsinks 604 may not include channels or air dams as channel-less heatsinks 604 may be furthest from the source of cooling airflow.

The designated path of cooling airflow for computer cooling system 600 may cross one or more adjacent modified heatsinks and/or reach one or more channel-less heatsinks. For example, the bottom left modified heatsink may direct cooling airflow to the adjacent modified heatsinks. The channels of the adjacent modified heatsinks may receive faster and cooler airflow from the channels of the bottom left modified heatsink and may also receive slower and warmer airflow from the fins of the bottom left modified heatsink. Each adjacent modified heatsink may also receive cooling airflow from multiple other modified heatsinks. The adjacent modified heatsinks may then direct cooling airflow to channel-less heatsinks 604.

Figure 7:
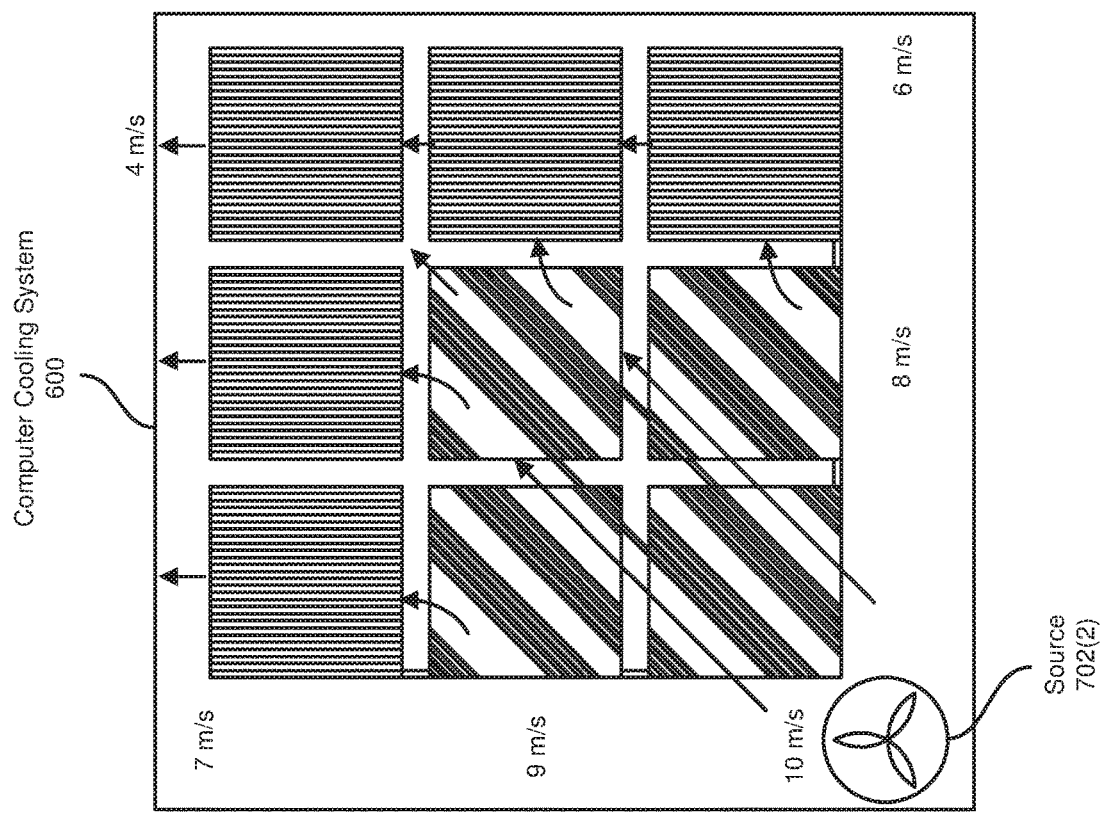
FIG. 7 is a comparison of airflow for an example channel-less cooling system with the example computer cooling system of FIG. 6.
Figure 7:
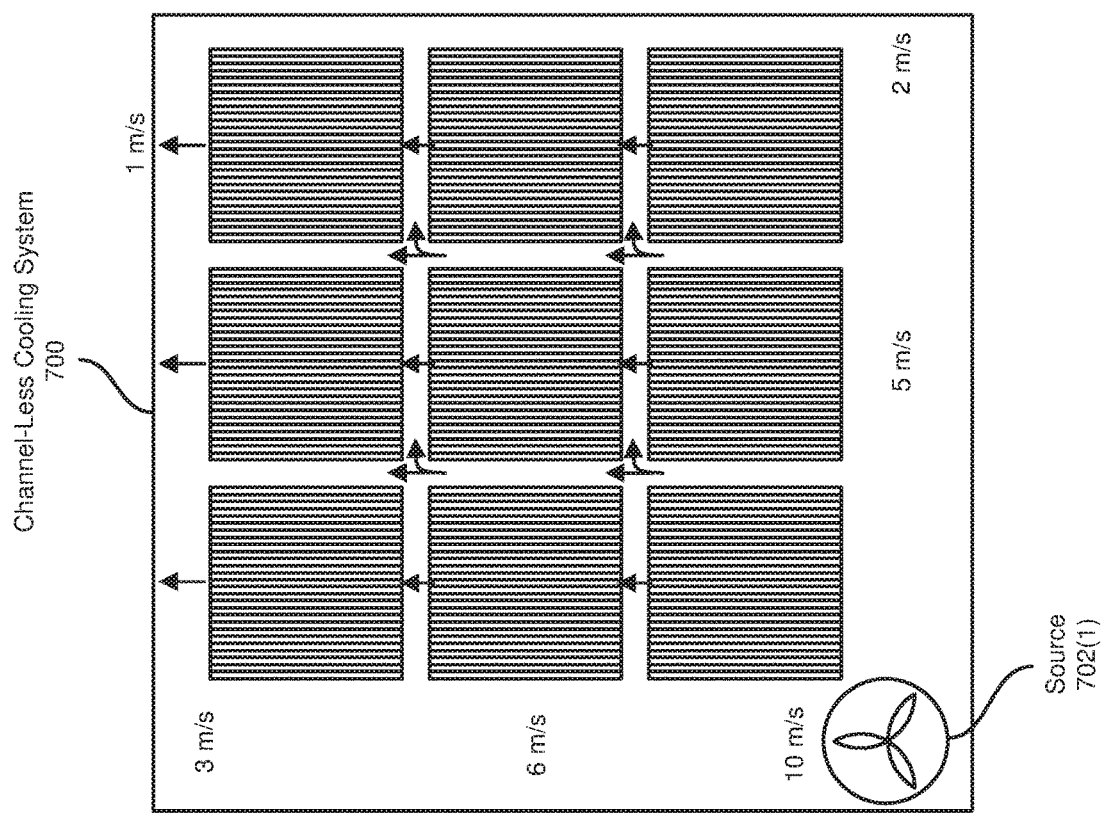

FIG. 7 illustrates a comparison of airflow for a channel-less cooling system 700 with computer cooling system 600 of FIG. 6. As illustrated in FIG. 7, channel-less cooling system 700 may have a single source 702(1) of cooling airflow, and computer cooling system 600 may have a similar source 702(2) of cooling airflow. Although illustrated with a single source of cooling airflow, computer cooling system 600 may include multiple sources of cooling airflow positioned at different points and/or share a source of cooling airflow with multiple printed circuit boards. In other words, the cooling systems described herein may be implemented locally or globally to maximize computing component cooling.

As illustrated in FIG. 7, the cooling airflow from source 702(1) may maintain an initial speed of 10 m/s and steadily decrease as the cooling airflow cools each channel-less heatsink from the bottom left to the top right. At the midway points, the cooling airflow may maintain speeds of 6 m/s and 5 m/s. The speed of air leaving the top right channel-less heatsink may be reduced to 1 m/s. In contrast, the channels of the modified heatsinks in computer cooling system 600 may provide some faster airflow across the modified heatsinks. At the midway points of computer cooling system 600, the cooling airflow may maintain higher speeds of 9 m/s and 8 m/s, which may provide faster cooling airflow to the channel-less heatsinks.

Figure 8:
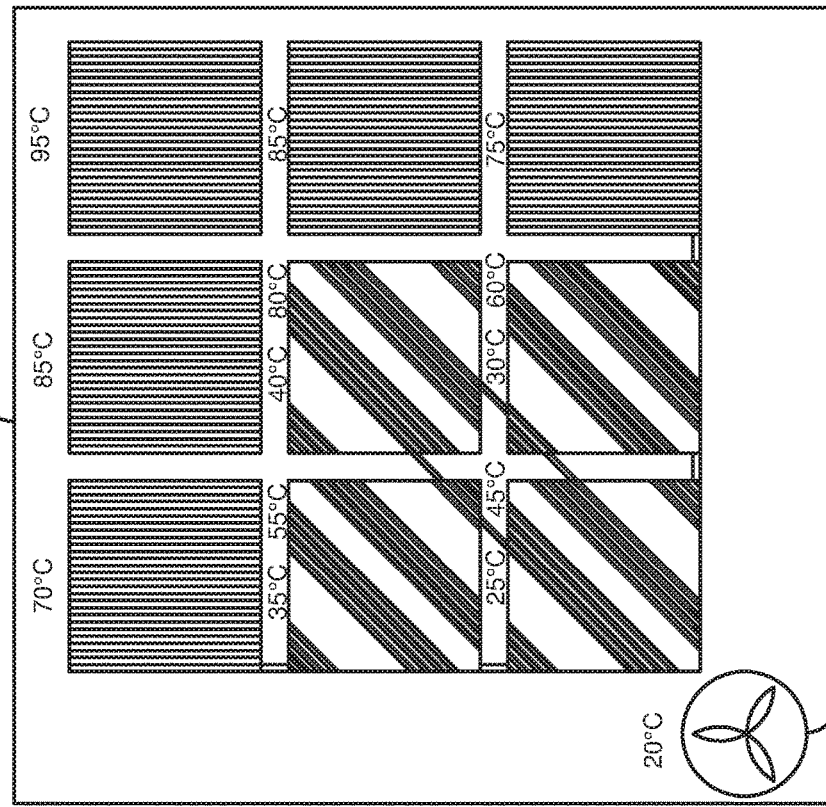
FIG. 8 is a comparison of temperatures for an example channel-less cooling system with the example computer cooling system of FIG. 6.
Figure 8:
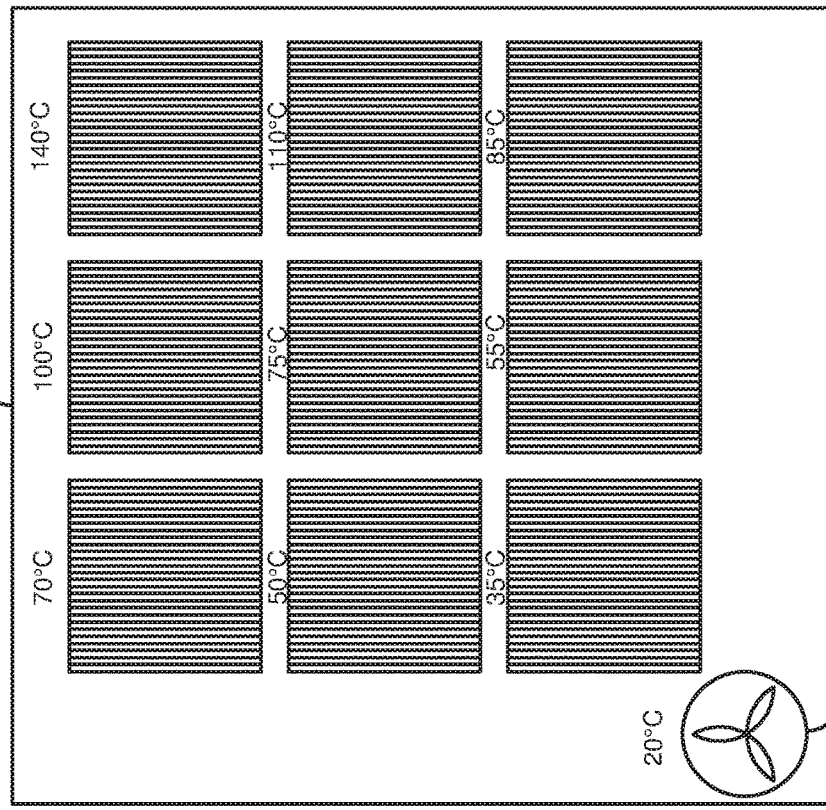

FIG. 8 shows a comparison of temperatures for channel-less cooling system 700 with computer cooling system 600 of FIG. 6. As shown in FIG. 8, source 702(1) and source 702(2) may provide lower temperature air to the printed circuit boards of channel-less cooling system 700 and computer cooling system 600, respectively. The channels of the modified heatsinks of computer cooling system 600 may be designed to decrease an overall temperature of the printed circuit board.

In the example of FIG. 8, sources 702(1) and 702(2) may provide cooling airflow at 20° C. For channel-less cooling system 700, the channel-less heatsinks further from source 702(1) may be incrementally hotter. For example, the bottom left channel-less heatsink may be cooled to 35° C., but the 35° C. cooling airflow entering the middle left channel-less heatsink may only result in cooling the middle left channel-less heatsink to 50° C. At the top right channel-less heatsink, the temperature may become a very hot 140° C., which may be detrimental to the performance of the computing component coupled to the top right channel-less heatsink. In contrast, for computer cooling system 600, the modified heatsinks may initially result in higher heatsink temperatures than their counterparts in channel-less cooling system 700. For example, the bottom left modified heatsink may be cooled to 45° C. from the plurality of fins. However, cooling airflow leaving the channels of the bottom left modified heatsink may maintain a cooler temperature at 25° C. The cooler airflow from the channels may then be directed toward the channel-less heatsinks, which may result in a lower temperature of 95° C. for the top right channel-less heatsink. Thus, despite higher initial temperatures, the overall temperatures of computer cooling system 600 may be lower than the overall temperatures of channel-less cooling system 700. Furthermore, computer cooling system 600 may prevent any individual computing components from overheating despite being further from source 702(2).

Figure 9:
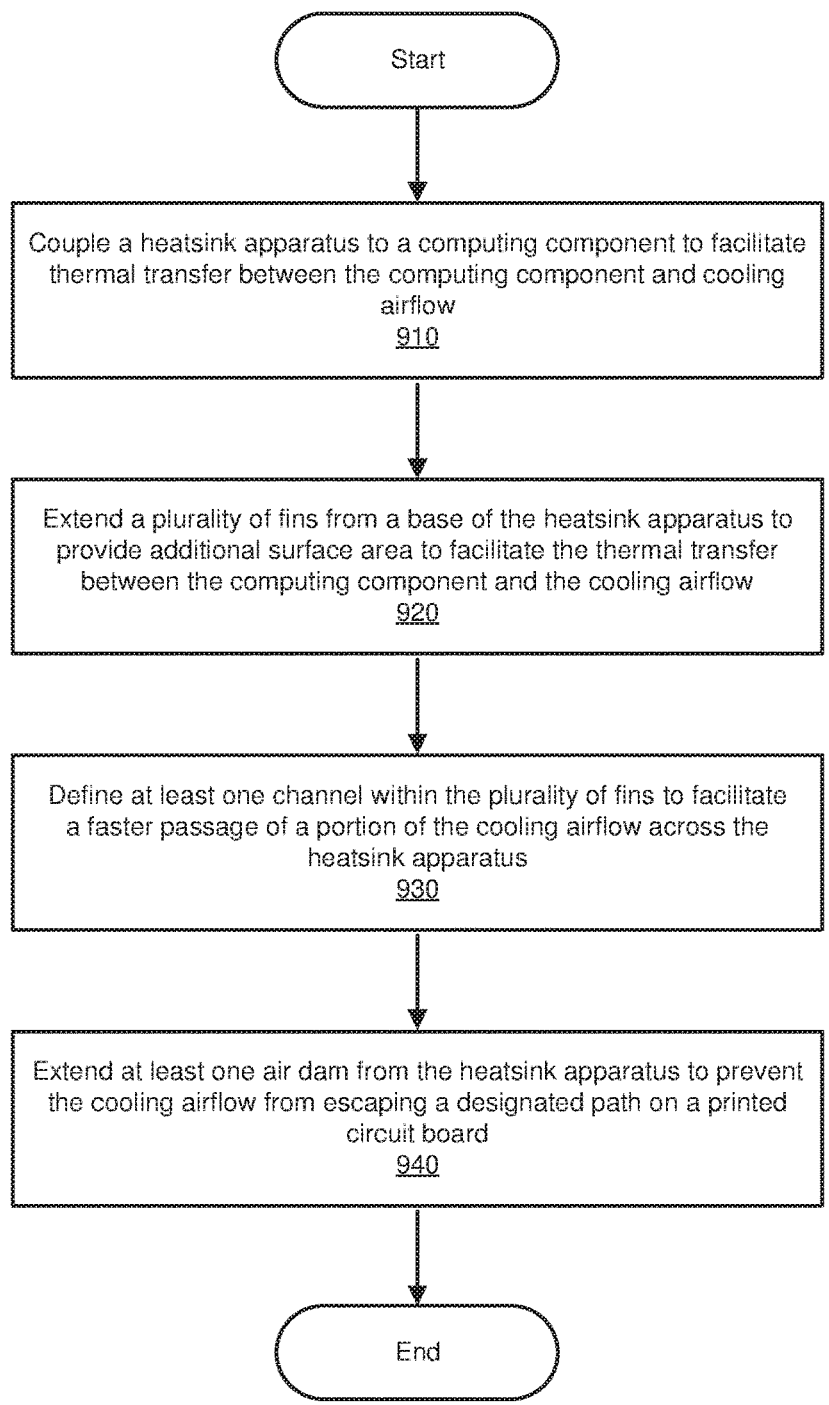
FIG. 9 is a flow diagram of an example method for improved cooling of computing components with heatsinks.

FIG. 9 is a flow diagram of an example method 900 for improved cooling of computing components with heatsinks. At step 910, a heatsink apparatus may be coupled to a computing component to facilitate thermal transfer between the computing component and cooling airflow. The heatsink apparatus may be coupled to the computing component in a variety of ways. In some embodiments, a base of the heatsink apparatus may be coupled to the computing component with a bonding agent. For example, as shown in FIG. 3, base 102 of modified heatsink 200 may be coupled to computing component 302 with bonding agent 306. In other embodiments, the heatsink apparatus may be mounted on a printed circuit board such that the base of the heatsink apparatus is in contact with the computing component.

At step 920 of FIG. 9, a plurality of fins may be extended from the base of the heatsink apparatus to provide additional surface area to facilitate the thermal transfer between the computing component and the cooling airflow. The plurality of fins may be extended in a variety of ways. For example, as illustrated in FIG. 1, fins 104 may be extended perpendicular from base 102 of modified heatsink 100. Alternatively, fins 104 may be extended at varying angles to base 102 or shaped with curves. Other fin designs, such as pin fins, may also be used.

At step 930, one or more channels may be defined within the plurality of fins to facilitate a faster passage of a portion of the cooling airflow across the heatsink apparatus. The channels may be defined within the fins in a variety of ways. In one embodiment, the channels may be defined by removing excess fins and/or carving existing fins to create wider gaps. Alternatively, the channels may be created by sculpting or arranging fins to extend from the base in a manner that forms such passages to allow faster airflow.

In some examples, defining a channel may include controlling a direction of a portion of the cooling airflow, increasing a speed of the portion of the cooling airflow in comparison to the cooling airflow moving between the fins, decreasing a temperature of the portion of the cooling airflow in comparison to the cooling airflow moving between the fins, and decreasing an overall temperature of the printed circuit board. For example, as illustrated in FIG. 5, the channels of modified heatsink 100 may provide faster and cooler air to channel-less heatsink 400 than the airflow through the fins of modified heatsink 100. In the example of FIGS. 6-7, the channels of modified heatsinks 602 may be angled diagonally to provide faster and cooler air based on the positions of modified heatsinks 602 relative to channel-less heatsinks 604, such that the overall temperature of printed circuit board 304 may be decreased.

Returning to FIG. 9, at step 940, one or more air dams may be extended from the heatsink apparatus to prevent the cooling airflow from escaping a designated path on the printed circuit board. The air dams may be extended from the heatsink apparatus in a variety of ways. In one embodiment, an air dam may be extended to direct the cooling airflow to one or more adjacent heatsink apparatuses. In the example of FIG. 4, air dam 108(1) and air dam 108(2) may be extended from the fins of modified heatsink 100 to direct air to channel-less heatsink 400(3). In the example of FIG. 6, some modified heatsinks may include air dams extended to direct cooling airflow from channels to an adjacent heatsink. Additionally or alternatively, an air dam may be extended to direct the cooling airflow to one or more adjacent computing components, which may or may not be coupled to heatsinks.

In some embodiments, method 900 of FIG. 9 may further include fitting a U-shaped insulator into a channel such that the U-shaped insulator provides insulation to reduce thermal transfer between the heatsink apparatus and the portion of the cooling airflow moving through the channel. For example, as shown in FIG. 2, insulator 202 may be fitted to channel 106(2) to provide insulation to reduce thermal transfer between modified heatsink 200 and the cooling airflow. Insulator 202 may additionally increase the speed and decrease the temperature of the cooling airflow in comparison to channels without insulators.

As discussed throughout the instant disclosure, the disclosed methods, systems, and apparatuses may provide one or more advantages over traditional cooling systems using traditional heatsinks. For example, by creating channels to ensure a portion of cooling air flows through faster with less resistance, the disclosed modified heatsinks may decrease the temperature of air that reaches downstream components. Furthermore, by using air dams extending to adjacent heatsinks, the disclosed modified heatsinks may prevent air from escaping before reaching a downstream component. Thus, by designing channels and air dams to optimize cooling airflow, the computer cooling systems described herein may prevent overheating of computing components further from a source of cooling airflow and improve the overall cooling of a set of computing components.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A heatsink apparatus comprising:
   a base that facilitates thermal transfer between a computing component and cooling airflow;
   a plurality of fins, extending from the base, that provide additional surface area to facilitate the thermal transfer between the computing component and the cooling airflow;
   at least one channel, defined within the plurality of fins, that facilitates a faster passage of a portion of the cooling airflow across the heatsink apparatus in comparison to the cooling airflow moving between the plurality of fins of the heatsink apparatus;
   at least one U-shaped insulator fitted to a channel to provide insulation to reduce thermal transfer between the heatsink apparatus and the portion of the cooling airflow moving through the channel; and
   at least one air dam that prevents the cooling airflow from escaping a designated path on a printed circuit board, the air dam extending from the heatsink apparatus and reaching a downstream component to prevent the cooling airflow from escaping from a gap between the heatsink apparatus and the downstream component.

2. The heatsink apparatus of claim 1, wherein the base is coupled to the computing component to facilitate the thermal transfer between the computing component and the cooling airflow.

3. The heatsink apparatus of claim 1, wherein the plurality of fins:
   facilitates thermal transfer between the base and the cooling airflow; and
   controls a direction of the cooling airflow moving between the plurality of fins.

4. The heatsink apparatus of claim 1, wherein the channel is designed based on a location of the heatsink apparatus on the printed circuit board and:
   controls a direction of the portion of the cooling airflow;
   increases a speed of the portion of the cooling airflow in comparison to the cooling airflow moving between the plurality of fins;
   decreases a temperature of the portion of the cooling airflow in comparison to the cooling airflow moving between the plurality of fins; and
   decreases an overall temperature of the printed circuit board.

5. The heatsink apparatus of claim 1, wherein the air dam extends from the heatsink apparatus to direct the cooling airflow to at least one of:
   an adjacent heatsink apparatus; and
   an adjacent computing component.

6. The heatsink apparatus of claim 1, wherein the U-shaped insulator covers fins and a portion of the base exposed by the channel.

7. A computer cooling system comprising:
   a printed circuit board;
   at least one central computing component mounted on the printed circuit board; and
   a modified heatsink coupled to the central computing component to facilitate thermal transfer between the central computing component and cooling airflow, the modified heatsink comprising:
   a base coupled to the central computing component;
   a plurality of fins extending from the base;
   at least one channel, defined within the plurality of fins, that facilitates a faster passage of a portion of the cooling airflow across the modified heatsink in comparison to the cooling airflow moving between the plurality of fins of the heatsink apparatus;
   at least one U-shaped insulator fitted to a channel to provide insulation to reduce thermal transfer between the modified heatsink and the portion of the cooling airflow moving through the channel; and
   at least one air dam, extending from the modified heatsink and reaching a downstream component to prevent the cooling airflow from escaping from a gap between the modified heatsink and the downstream component, that prevents the cooling airflow from escaping a designated path on the printed circuit board.

8. The computer cooling system of claim 7, wherein the modified heatsink is coupled to the central computing component by at least one of:
   coupling the base to the central computing component with a bonding agent; and
   mounting the modified heatsink on the printed circuit board such that the base is in contact with the central computing component.

9. The computer cooling system of claim 7, wherein the designated path achieves at least one of:
   crossing at least one adjacent modified heatsink; and
   reaching at least one channel-less heatsink.

10. The computer cooling system of claim 9, wherein the adjacent modified heatsink is coupled to an adjacent central computing component to facilitate thermal transfer between the adjacent central computing component and the cooling airflow.

11. The computer cooling system of claim 9, wherein the adjacent modified heatsink comprises:
   an additional base coupled to the adjacent central computing component;
   an additional plurality of fins extending from the additional base;
   at least one additional channel, defined within the additional plurality of fins, that facilitates a faster passage of an additional portion of the cooling airflow across the adjacent modified heatsink; and
   at least one additional air dam, extending from the adjacent modified heatsink and reaching an additional downstream component to prevent the cooling airflow from escaping from a gap between the adjacent modified heatsink and the additional downstream component, that prevents the cooling airflow from escaping the designated path on the printed circuit board.

12. The computer cooling system of claim 11, wherein the additional channel is fitted with an additional U-shaped insulator to provide insulation to reduce thermal transfer between the adjacent modified heatsink and the additional portion of the cooling airflow moving through the additional channel, wherein the additional U-shaped insulator covers additional fins and an additional portion of the additional base exposed by the additional channel.

13. The computer cooling system of claim 9, wherein the channel-less heatsink is coupled to an edge computing component to facilitate thermal transfer between the edge computing component and the cooling airflow.

14. The computer cooling system of claim 9, wherein the channel-less heatsink comprises:
   a secondary base coupled to the edge computing component; and
   a plurality of channel-less fins extending from the secondary base.

15. The computer cooling system of claim 7, further comprising at least one source of the cooling airflow that provides lower temperature air to the printed circuit board.

16. A method comprising:
   coupling a heatsink apparatus to a computing component to facilitate thermal transfer between the computing component and cooling airflow;
   extending a plurality of fins from a base of the heatsink apparatus to provide additional surface area to facilitate the thermal transfer between the computing component and the cooling airflow;
   defining at least one channel within the plurality of fins to facilitate a faster passage of a portion of the cooling airflow across the heatsink apparatus in comparison to the cooling airflow moving between the plurality of fins of the heatsink apparatus;
   fitting at least one U-shaped insulator into a channel to provide insulation to reduce thermal transfer between the heatsink apparatus and the portion of the cooling airflow moving through the channel; and
   extending at least one air dam from the heatsink apparatus to prevent the cooling airflow from escaping a designated path on a printed circuit board, the air dam extending from the heatsink apparatus and reaching a downstream component to prevent the cooling airflow from escaping from a gap between the heatsink apparatus and the downstream component.

17. The method of claim 16, wherein coupling the heatsink apparatus to the computing component comprises at least one of:
   coupling the base of the heatsink apparatus to the computing component with a bonding agent; and
   mounting the heatsink apparatus on the printed circuit board such that the base of the heatsink apparatus is in contact with the computing component.

18. The method of claim 17, wherein fitting the U-shaped insulator into the channel comprises ensuring the U-shaped insulator covers fins and a portion of the base exposed by the channel.

19. The method of claim 16, wherein defining the channel within the plurality of fins comprises:
   controlling a direction of the portion of the cooling airflow;
   increasing a speed of the portion of the cooling airflow in comparison to the cooling airflow moving between the plurality of fins;
   decreasing a temperature of the portion of the cooling airflow in comparison to the cooling airflow moving between the plurality of fins; and
   decreasing an overall temperature of the printed circuit board.

20. The method of claim 16, wherein extending the air dam from the heatsink apparatus comprises directing the cooling airflow to at least one of:
   an adjacent heatsink apparatus; and
   an adjacent computing component.

* * * * *